(12) United States Patent
Miyazaki et al.

(10) Patent No.: US 11,090,692 B2
(45) Date of Patent: Aug. 17, 2021

(54) CLEANING LIQUID SUPPLYING SYSTEM, SUBSTRATE PROCESSING APPARATUS AND SUBSTRATE PROCESSING SYSTEM

(71) Applicant: Ebara Corporation, Tokyo (JP)

(72) Inventors: Mitsuru Miyazaki, Tokyo (JP); Akira Imamura, Tokyo (JP); Takuya Inoue, Tokyo (JP); Shozo Takahashi, Tokyo (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 16/373,004

(22) Filed: Apr. 2, 2019

(65) Prior Publication Data

US 2019/0308223 A1   Oct. 10, 2019

(30) Foreign Application Priority Data

Apr. 5, 2018 (JP) .............................. JP2018-072976

(51) Int. Cl.
*B08B 3/04* (2006.01)
*H01L 21/67* (2006.01)
*G05D 16/20* (2006.01)

(52) U.S. Cl.
CPC ........... *B08B 3/04* (2013.01); *G05D 16/2013* (2013.01); *H01L 21/67051* (2013.01)

(58) Field of Classification Search
CPC ........... B08B 3/04; B08B 3/00; B08B 9/0328; B08B 9/0325; H01L 21/67051; H01L 21/67017; G05D 16/2013
See application file for complete search history.

(56) References Cited

U.S. PATENT DOCUMENTS

2003/0159716 A1* 8/2003 Nagai ............... H01L 21/67051
134/19
2015/0328668 A1* 11/2015 Koyama ........... H01L 21/67017
134/22.12

FOREIGN PATENT DOCUMENTS

JP          2014-039064 A    2/2014

* cited by examiner

*Primary Examiner* — Michael R Reid
(74) *Attorney, Agent, or Firm* — Leydig, Voit & Mayer, Ltd.

(57) ABSTRACT

According to one embodiment, provided is a cleaning liquid supplying system including: a circulation line in which cleaning liquid flows, first end of the circulation line being connected to a supply port of a cleaning liquid supplying apparatus, second end of the circulation line being connected to a collection port of the cleaning liquid supplying apparatus; a branch pipe branched from the circulation line and connected to a substrate cleaning unit; a valve provided on the branch pipe and configured to control supply of cleaning liquid from the circulation line to the substrate cleaning unit; and a flow rate adjuster configured to adjust a flow rate of the cleaning liquid flowing in the circulation line.

9 Claims, 9 Drawing Sheets

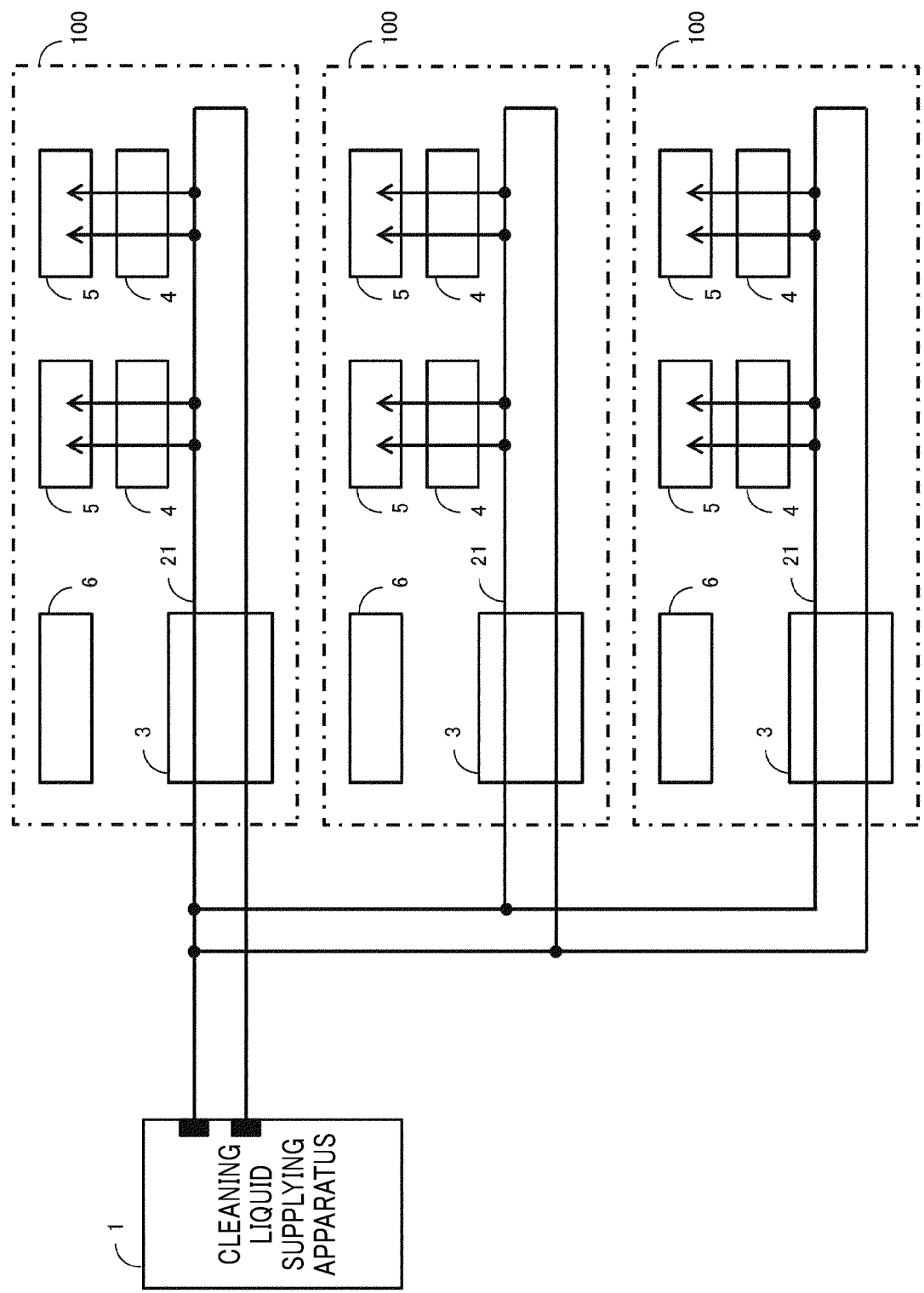

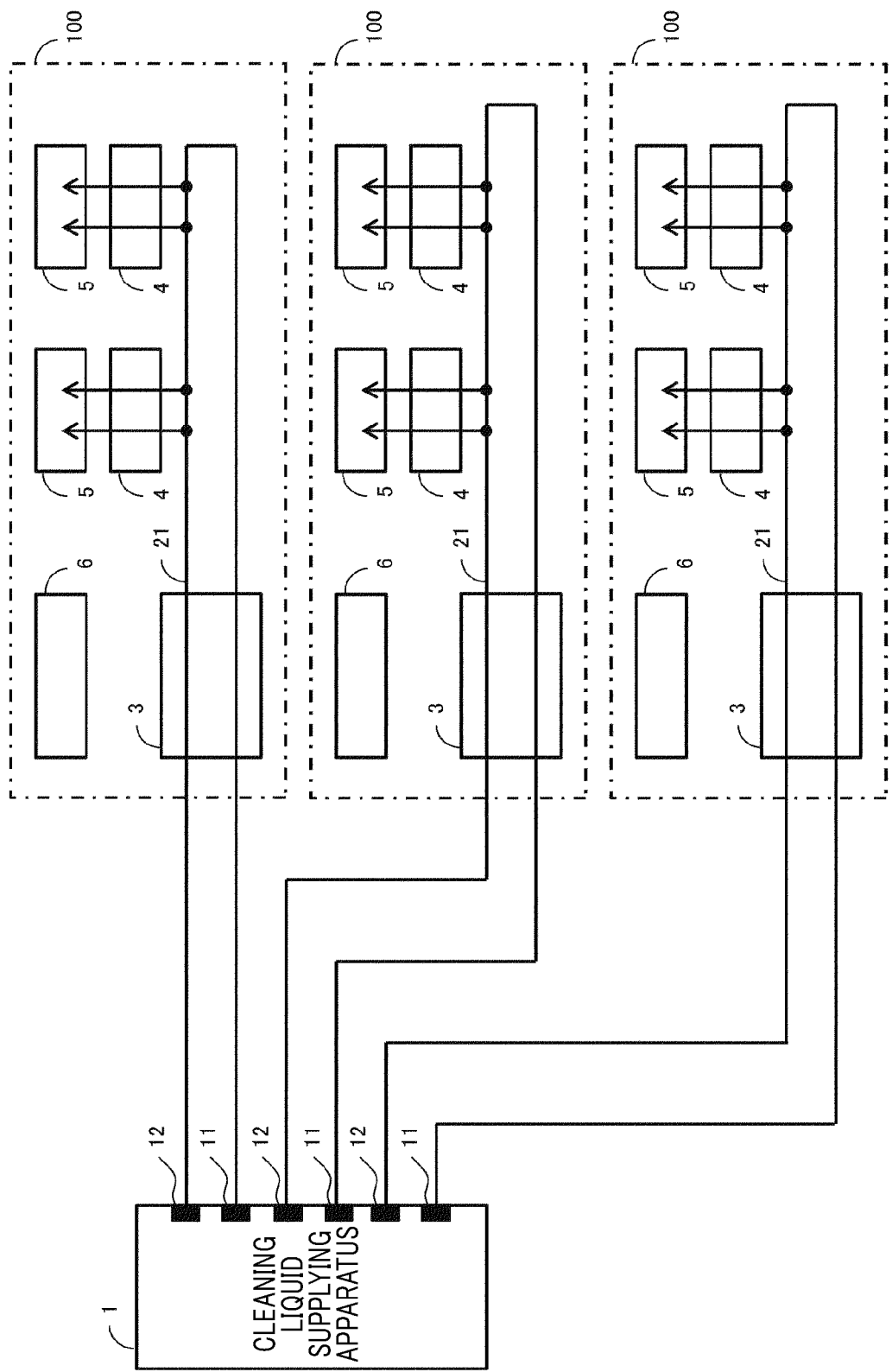

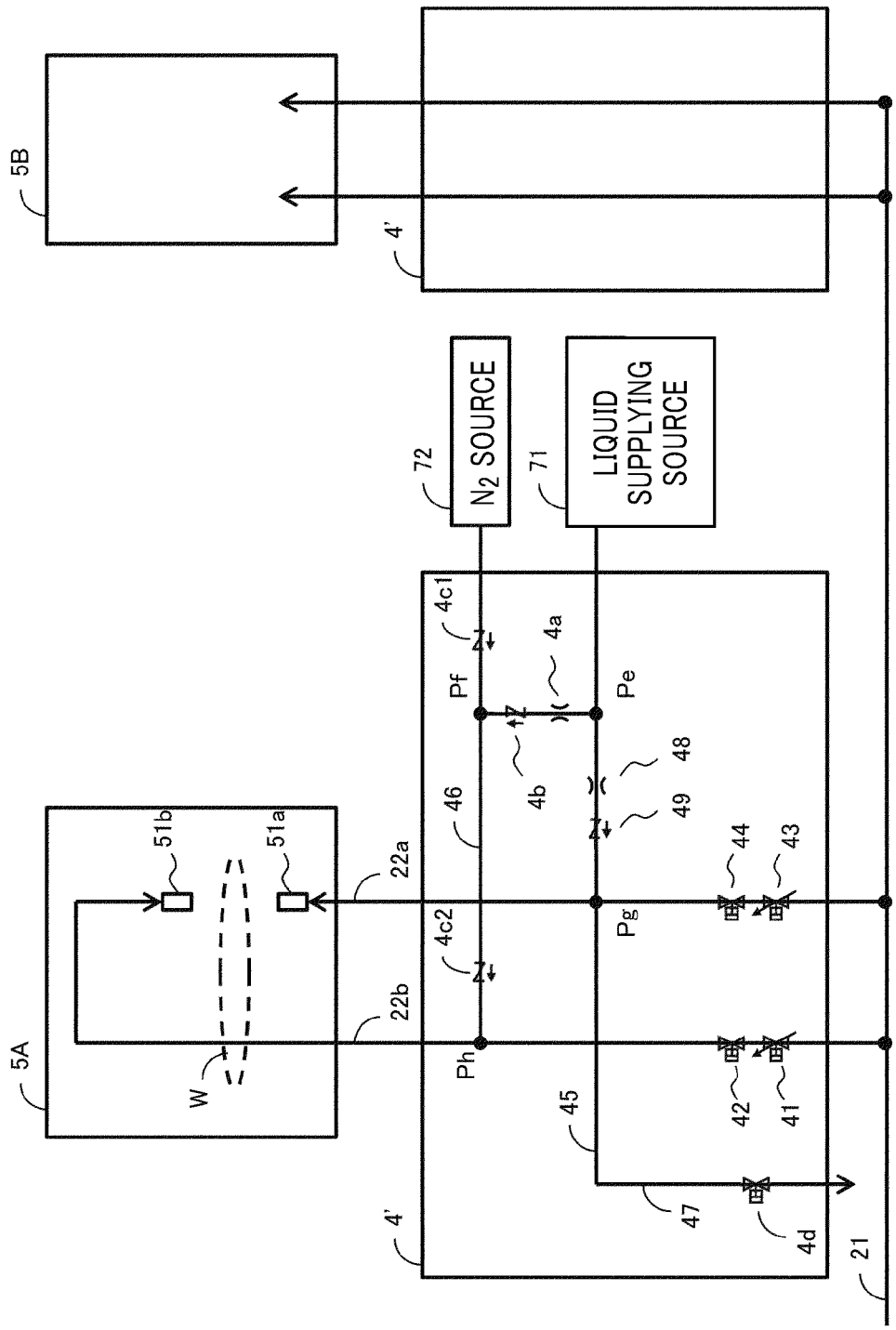

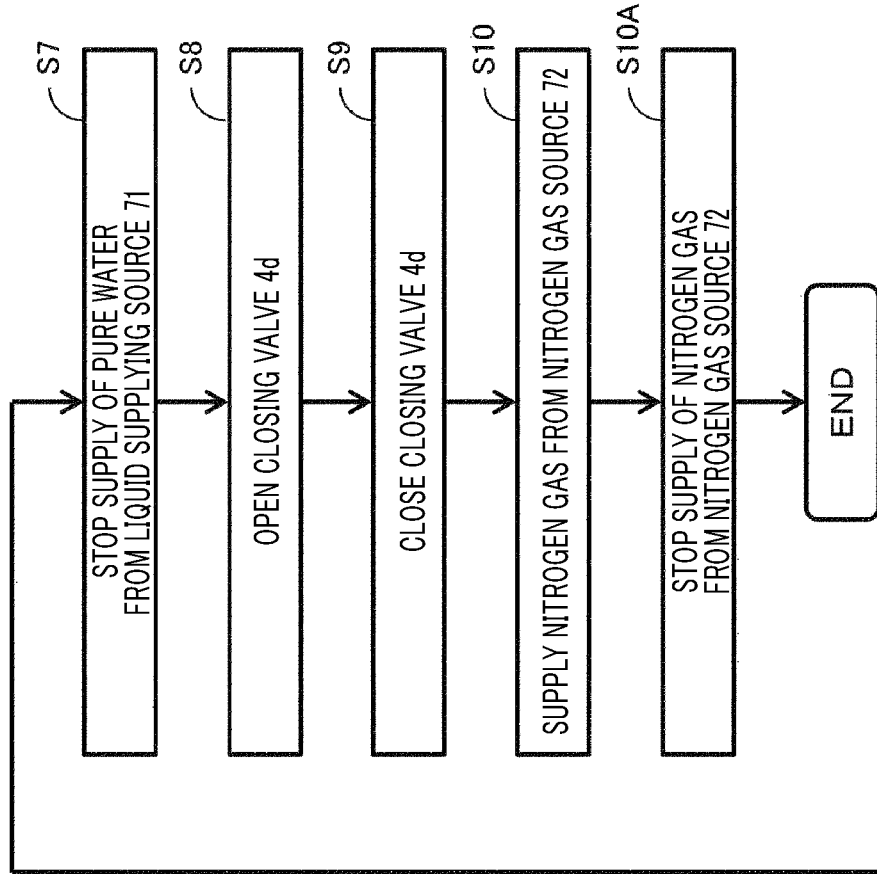
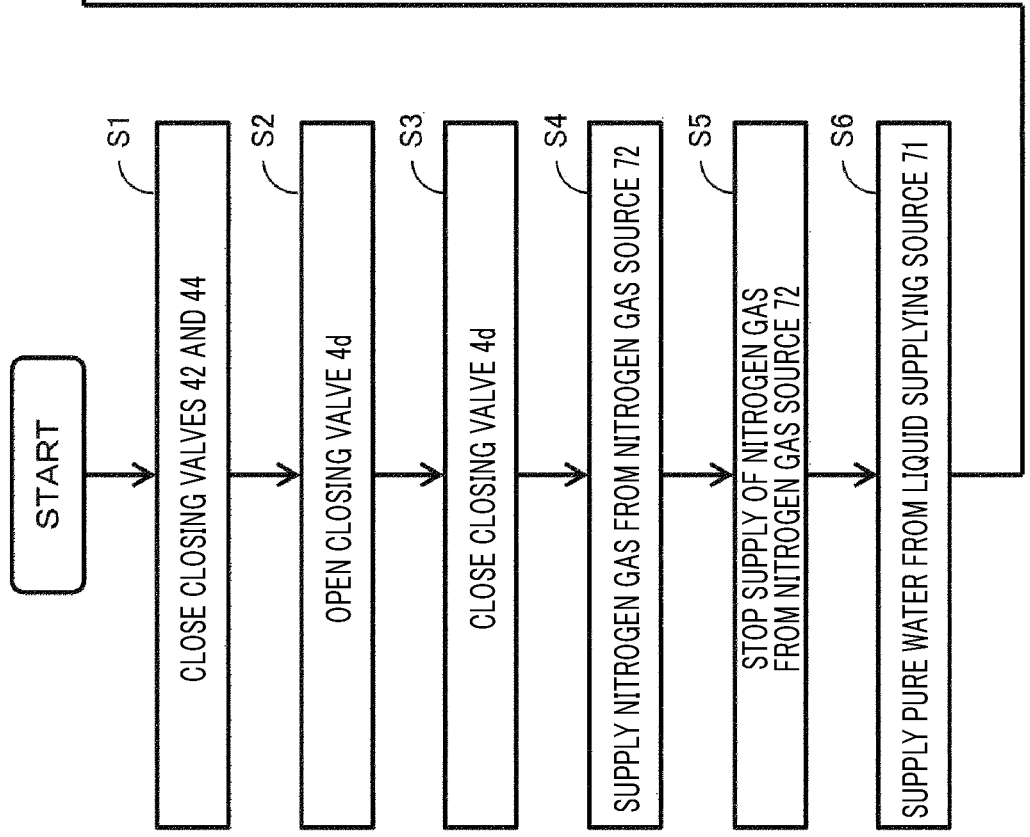
FIG.3

CLEANING LIQUID SUPPLYING SYSTEM, SUBSTRATE PROCESSING APPARATUS AND SUBSTRATE PROCESSING SYSTEM

CROSS REFERENCE TO RELATED APPLICATIONS

This application claims the benefit of Japanese Priority Patent Application JP 2018-72976 filed on Apr. 5, 2018, the entire contents of which are incorporated herein by reference.

FIELD

Embodiments of the present inventions generally relates to a cleaning liquid supplying system, a substrate processing apparatus and substrate processing system. More particularly, embodiments of the present invention provide a cleaning liquid supplying system that supplies cleaning liquid to a substrate cleaning unit, a substrate processing apparatus including such a cleaning liquid supplying system, and a substrate processing system including such a substrate processing apparatus.

BACKGROUND

It is common that a substrate is cleaned while cleaning liquid is being supplied. For example, in JP 2014-39064 A, there is cleaning liquid supplying system having one cleaning liquid supplying source supplies cleaning liquid to a plurality of substrate cleaning apparatuses (or modules).

When using such a conventional substrate cleaning system, Applicant newly found the cleaning liquid cannot be appropriately supplied to the plurality of substrate cleaning apparatuses (modules), i.e., each cleaning liquid supplied to each substrate cleaning apparatuses (modules) is not always met with the preferred condition (e.g. liquid pressure) for each substrate cleaning apparatuses (modules).

Furthermore, in such conventional substrate cleaning system maintenance tends to be difficult to be carried out.

Therefore, there is a need for an improved cleaning liquid supplying system to supply the cleaning liquid to the plurality of substrate cleaning apparatuses, a substrate processing apparatus including such a cleaning liquid supplying system, and a substrate processing system including such a substrate processing apparatus.

SUMMARY

The present inventions generally relates to a cleaning liquid supplying system for use in a substrate cleaning apparatus, a related substrate processing apparatus and substrate processing system. Particularly, embodiments of the present invention provide a cleaning liquid supplying system that supplies cleaning liquid to a substrate cleaning unit, a substrate processing apparatus including such a cleaning liquid supplying system, and a substrate processing system including such a substrate processing apparatus.

According to one embodiment, provided is a cleaning liquid supplying system comprising: a circulation line in which cleaning liquid flows, first end of the circulation line being connected to a supply port of a cleaning liquid supplying apparatus, second end of the circulation line being connected to a collection port of the cleaning liquid supplying apparatus; a branch pipe branched from the circulation line and connected to a substrate cleaning unit; a valve provided on the branch pipe and configured to control supply of cleaning liquid from the circulation line to the substrate cleaning unit; and a flow rate adjuster configured to adjust a flow rate of the cleaning liquid flowing in the circulation line.

According to another embodiment, provided is a cleaning liquid supplying system comprising: a circulation line in which cleaning liquid flows, first end of the circulation line being connected to a supply port of a cleaning liquid supplying apparatus, second end of the circulation line being connected to a collection port of the cleaning liquid supplying apparatus; a branch pipe branched from the circulation line and connected to a substrate cleaning unit; a nitrogen gas supplying source configured to supply nitrogen gas to the branch pipe; a liquid supplying source configured to supply liquid that reacts with the cleaning liquid to the branch pipe; and a valve provided on the branch pipe and configured to control supply of liquid from the circulation line to the substrate cleaning unit, wherein in a state where the cleaning liquid is not supplied from the circulation line to the substrate cleaning unit, the valve enables supplying the nitrogen gas from the nitrogen gas supplying source to the substrate cleaning unit, and supplying the liquid from the liquid supplying source to the substrate cleaning unit.

According to another embodiment, provided is a cleaning liquid supplying system comprising: a circulation line in which cleaning liquid flows, first end of the circulation line being connected to a supply port of a cleaning liquid supplying apparatus, second end of the circulation line being connected to a collection port of the cleaning liquid supplying apparatus; a branch pipe branched from the circulation line and connected to a substrate cleaning unit; a liquid supplying source configured to supply liquid that reacts with the cleaning liquid to the branch pipe; a drain pipe configured to communicate with the branch pipe; a first valve provided on the branch pipe and configured to control supply of liquid from the circulation line to the substrate cleaning unit; and a second valve provided on the drain pipe, wherein in a state where the cleaning liquid is not supplied from the circulation line to the substrate cleaning unit, the first valve and the second valve enable discharging the cleaning liquid in the branch pipe from the drain pipe, and supplying the liquid from the liquid supplying source to the substrate cleaning unit.

According to one embodiment, provided is a cleaning liquid supplying system comprising: a circulation line in which cleaning liquid flows, first end of the circulation line being connected to a supply port of a cleaning liquid supplying apparatus, second end of the circulation line being connected to a collection port of the cleaning liquid supplying apparatus; a branch pipe branched from the circulation line and connected to a substrate cleaning unit; a nitrogen gas supplying source configured to supply nitrogen gas to the circulation line through a pipe; a liquid supplying source configured to supply liquid that reacts with the cleaning liquid to the circulation line through the pipe; a drain pipe configured to be connected to the circulation line; a first valve provided on the pipe and configured to control supply of nitrogen gas from the nitrogen gas supplying source to the circulation line and supply of liquid from the liquid supplying source to the circulation line; and a second valve provided on the drain pipe, wherein in a state where the cleaning liquid is not supplied from the cleaning liquid supplying apparatus to the circulation line, the first valve and the second valve enable discharging the cleaning liquid in the circulation line from the drain pipe, supplying the nitrogen gas from the nitrogen gas supplying source to the circulation line, and supplying the liquid from the liquid supplying source to the circulation line.

According to another embodiment, provided is a cleaning liquid supplying system comprising: a circulation line in which cleaning liquid flows, first end of the circulation line being connected to a supply port of a cleaning liquid supplying apparatus, second end of the circulation line being connected to a collection port of the cleaning liquid supplying apparatus; a branch pipe branched from the circulation line and connected to a substrate cleaning unit; a nitrogen gas supplying source configured to supply nitrogen gas to the circulation line through a pipe; a liquid supplying source configured to supply liquid that reacts with the cleaning liquid to the circulation line through the pipe; and a valve provided on the pipe and configured to control supply of nitrogen gas from the nitrogen gas supplying source to the circulation line and supply of liquid from the liquid supplying source to the circulation line.

According to another embodiment, provided is a substrate processing apparatus comprising: the substrate cleaning unit; and the cleaning liquid supplying system.

According to another embodiment, provided is a substrate processing system comprising: the cleaning liquid supplying apparatus; and the substrate processing apparatus.

BRIEF DESCRIPTION OF DRAWINGS

FIG. 1A is a schematic configuration diagram of a substrate processing system which is a modified example of FIG. 1;

FIG. 1B is a schematic configuration diagram of a substrate processing system which is a modified example of FIG. 1;

FIG. 2 is a schematic configuration diagram of a substrate processing system according to a second embodiment;

FIG. 3 is a flowchart showing an example of a procedure where cleaning liquid in a substrate cleaning unit 5A is replaced with pure water in the substrate processing system according to the second embodiment;

DETAILED DESCRIPTION OF NON-LIMITING EXAMPLE EMBODIMENTS

Hereinafter, embodiment will be specifically described with reference to the drawings.

First Embodiment

Figure 1:
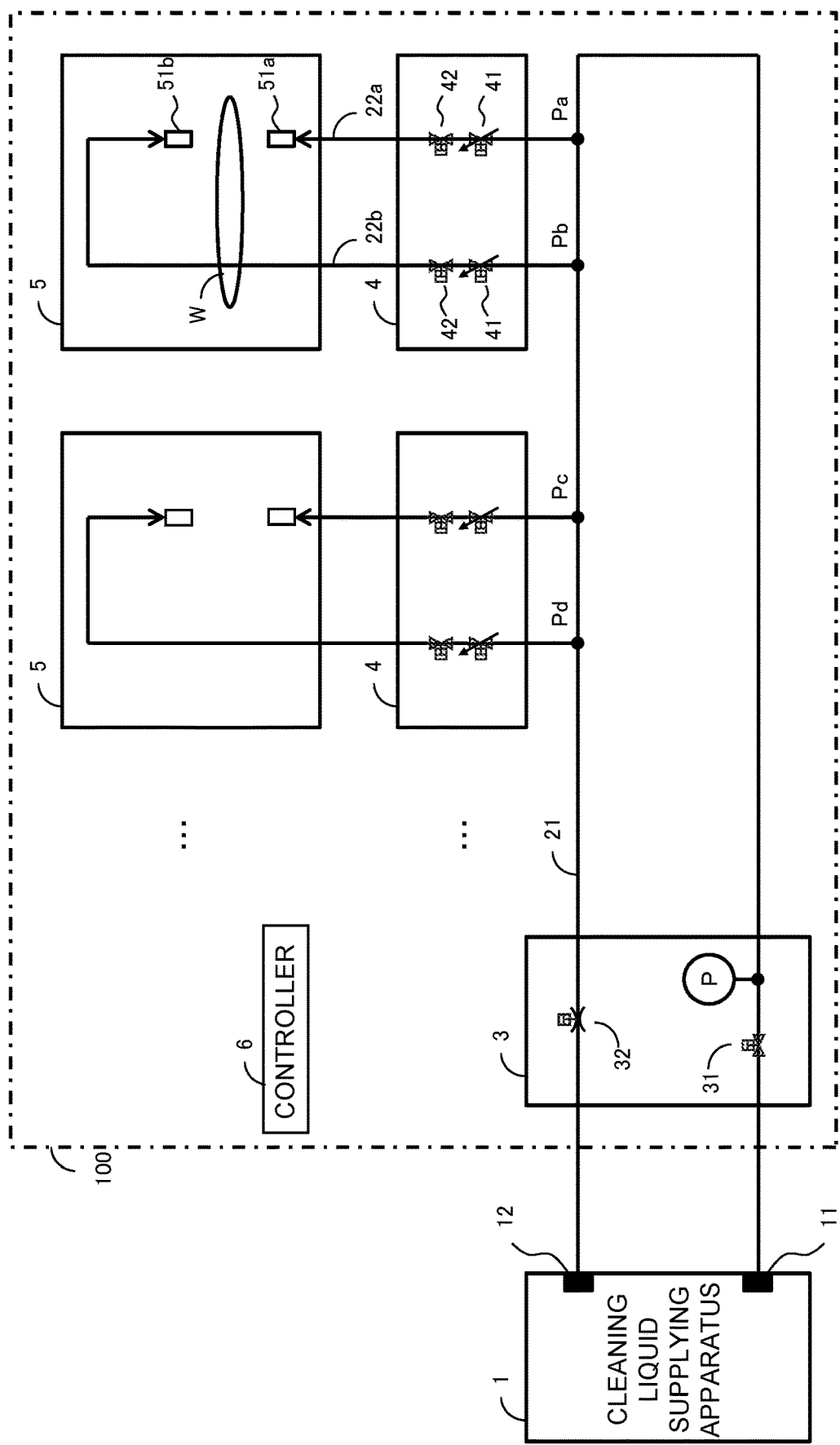
FIG. 1 is a schematic configuration diagram of a substrate processing system according to a first embodiment.

FIG. 1 is a schematic configuration diagram of a substrate processing system according to a first embodiment. The substrate processing system includes a cleaning liquid supplying apparatus 1, a circulation line 21, a plurality of branch pipes 22a and 22b, a circulation control unit 3, a plurality of cleaning liquid supplying units 4, a plurality of substrate cleaning units 5 respectively corresponding to the cleaning liquid supplying units 4, and a controller 6.

A cleaning liquid supplying system can be formed by the circulation line 21, the branch pipes 22a and 22b, the circulation control unit 3, the cleaning liquid supplying units 4, and the controller 6 (or some of these can be omitted according to the system).

A substrate processing apparatus 100 can be formed by the cleaning liquid supplying system and the substrate cleaning units 5 (or some of these can be omitted according to the system).

In the present embodiment, a plurality of substrate cleaning units 5 are provided for one cleaning liquid supplying apparatus 1. When a request signal for supply of cleaning liquid is transmitted from a specific substrate cleaning unit 5 and subsequently received such request signal by the controller 6, the controller 6 controls to start the cleaning liquid to supply from the cleaning liquid supplying apparatus 1 to the substrate cleaning unit 5. Alternatively, when a request signal generated in the controller 6 which is triggered by some factor, the controller 6 controls to start the cleaning liquid to supply from the cleaning liquid supplying apparatus 1 to the substrate cleaning unit 5. In one embodiment, a request signal for supply of cleaning liquid is generated, the controller 6 can control to start the cleaning liquid to supply from the cleaning liquid supplying apparatus 1 to a substrate cleaning unit 5 specified by the controller 6.

In one embodiment, the cleaning liquid supplying apparatus 1 is composed of a tank in which the cleaning liquid such as sulfuric acid or hydrogen peroxide water is stored, a heater that controls the temperature of the cleaning liquid, a pump, and the like. The cleaning liquid supplying apparatus 1 has a supply port 11 from which the cleaning liquid is supplied to the outside and a collection port 12 where the cleaning liquid is collected.

One end of the circulation line 21 is connected to the supply port 11 of the cleaning liquid supplying apparatus 1, and another end of the circulation line 21 is connected to the collection port 12 of the cleaning liquid supplying apparatus 1. The circulation line 21 is branched at a plurality of points Pa, Pb, and so on in the middle of the circulation line 21. In other words, the branch pipes 22a and 22b are connected to the circulation line 21 so that the branch pipes 22a and 22b are branched from the plurality of points Pa and Pb on the circulation line 21. Each of the branch pipes 22a and 22b is connected to the plurality of substrate cleaning units 5 through the cleaning liquid supplying unit 4.

The circulation control unit 3 is provided on the circulation line 21. The circulation control unit 3 has a closing valve 31, an electric flow rate adjusting valve 32, and a pressure gauge P. The closing valve 31 is provided on the circulation line 21, and is desirably provided between the point Pa nearest to the supply port 11 and the supply port 11. The electric flow rate adjusting valve 32 is provided on the circulation line 21, and is desirably provided between a branch point nearest to the collection port 12 and the collection port 12. The pressure gauge P is installed in an arbitrary position on the circulation line 21 and measures pressure of the cleaning liquid flowing through the circulation line 21. Information indicating the pressure is transmitted to the controller 6.

The cleaning liquid supplying unit 4 is provided to the branch pipes 22a and 22b. Specifically, the cleaning liquid supplying unit 4 has valves 41 and 42 provided to the branch pipes 22a and 22b. More specifically, the flow rate adjusting valve 41 and the closing valve 42 are provided to each of the branch pipes 22a and 22b.

The substrate cleaning unit 5 processes the substrate W by using the cleaning liquid from the cleaning liquid supplying apparatus 1 and has nozzles 51a and 51b that eject the cleaning liquid. Specifically, the nozzle 51a communicates with the branch pipe 22a and ejects the cleaning liquid toward (upward to) a lower surface of the substrate W. The nozzle 51b communicates with the branch pipe 22b and ejects the cleaning liquid toward an upper surface of the substrate W (alternatively the ejection direction of the liquid from the nozzle 51b can be downward to the upper surface of the substrate).

The controller 6 controls each component in the substrate processing system, and in particular, performs open/close control and opening degree adjustment of each valve.

As shown in FIG. 1A, a plurality of substrate processing apparatuses 100 may be connected to one cleaning liquid supplying apparatus 1 by branching the circulation line 21. Further, as shown in FIG. 1B, by providing a plurality of supply ports 11 and collection ports 12 to one cleaning liquid supplying apparatus 1, a plurality of substrate processing apparatuses 100 may be connected to each pair of the supply port 11 and the collection port 12.

The substrate processing system as described above operates as described below. When the closing valve 31 is opened and an opening degree of the electric flow rate adjusting valve 32 is set sufficiently large, the cleaning liquid is supplied from the cleaning liquid supplying apparatus 1 to the circulation line 21 through the supply port 11, and the cleaning liquid that has flown inside the circulation line 21 is collected by the cleaning liquid supplying apparatus 1 through the collection port 12. By circulating the cleaning liquid in this way, it is possible to suppress variation of the temperature and the density of the cleaning liquid.

When the valves 41 and 42 in a certain cleaning liquid supplying unit 4 are closed, the cleaning liquid is not supplied to a corresponding substrate cleaning unit 5. When the substrate cleaning unit 5 requests the cleaning liquid, the controller 6 opens the valves 41 and 42 in a corresponding cleaning liquid supplying unit 4 (it is assumed that the valves 41 and 42 provided on the branch pipe 22a are opened). Then, the cleaning liquid in the circulation line 21 flows into the branch pipe 22a, and the cleaning liquid is supplied to the substrate cleaning unit 5 and ejected from the nozzle 51a. The same goes for the other branch pipe 22b and the like. In this way, the valves 41 and 42 control the supply of cleaning liquid (the amount of supply of cleaning liquid) of the circulation line 21 to the substrate cleaning unit 5.

Here, when the cleaning liquid is supplied from the branch pipe 22a to the substrate cleaning unit 5, the pressure in the circulation line 21 decreases. The greater the opening degree of the flow rate adjusting valve 41, the greater the decrease of the pressure. The greater the number of the substrate cleaning units 5 to which the cleaning liquid is supplied, the greater the decrease of the pressure. In this case, the amount of supply of cleaning liquid may be insufficient with respect to an amount required by the substrate cleaning units 5.

Therefore, in the present embodiment, the electric flow rate adjusting valve 32 is provided in the circulation control unit 3, and the flow rate of the cleaning liquid flowing through the circulation line 21 can be adjusted. When a pressure decrease in the circulation line 21 is expected, the controller 6 decreases the opening degree of the electric flow rate adjusting valve 32. Thereby, it is possible to suppress the pressure decrease in the circulation line 21.

As a specific example, the controller 6 may decrease the flow rate by performing control so that the greater the number of the closing valves 42 that are opened or the greater the opening degree of the flow rate adjusting valve 41, the smaller the opening degree of the electric flow rate adjusting valve 32. The controller 6 may control the electric flow rate adjusting valve 32 so that the pressure is constant while watching a pressure measurement result of the pressure gauge P. The electric flow rate adjusting valve 32 may be manually controlled.

In this way, in the first embodiment, the electric flow rate adjusting valve 32 is provided on the circulation line 21. Therefore, even when the substrate cleaning unit 5 requests the cleaning liquid, it is possible to suppress the pressure decrease in the circulation line 21, and the cleaning liquid can be appropriately supplied to the substrate cleaning unit 5.

A means for adjusting the flow rate of the circulation line 21 is not limited to the electric flow rate adjusting valve 32. For example, it is possible to suppress the pressure decrease by decreasing the flow rate by arranging a plurality of closing valves in parallel and increasing the number of the closing valves to be closed if there is no problem of cost and installation space.

Second Embodiment

A second embodiment to be described next is to improve maintainability of the substrate cleaning unit 5.

In FIG. 1, a cleaning liquid such as sulfuric acid is supplied from the cleaning liquid supplying apparatus 1. On the other hand, when maintaining the substrate cleaning unit 5, the cleaning liquid remaining in the pipes and the nozzles 51a and 51b in the substrate cleaning unit 5 needs to be replaced with pure water. In the case of the substrate processing system as shown in FIG. 1, to maintain a certain substrate cleaning unit 5, it is necessary to supply pure water instead of the cleaning liquid from the cleaning liquid supplying apparatus 1 to the substrate cleaning unit 5. In this case, the pure water flows through the circulation line 21, so that the cleaning liquid cannot be supplied to the substrate cleaning units 5 that will not be maintained. Therefore, use of the substrate cleaning units 5 must be stopped.

Therefore, in the second embodiment, as described later, only the cleaning liquid in the substrate cleaning unit 5 to be maintained can be replaced with pure water while the cleaning liquid is being flown through the circulation line 21.

FIG. 2 is a schematic configuration diagram of a substrate processing system according to a second embodiment. In FIG. 2, the same components as those in FIG. 1 are omitted, and only cleaning liquid supplying units 4', substrate cleaning units 5A and 5B, and a liquid supplying source 71 and a nitrogen gas source 72 that are included in the substrate processing system (or the cleaning liquid supplying unit 4') are drawn. It is desirable that the liquid supplying source 71 and the nitrogen gas source 72 are provided to all the cleaning liquid supplying units 4'. However, the liquid supplying source 71 and the nitrogen gas source 72 may be provided to only some of the cleaning liquid supplying units 4'.

In the description below, it is assumed that the substrate cleaning unit 5A is an object of pure water replacement (maintenance) and the substrate cleaning unit 5B is not an object of pure water replacement (maintenance) in FIG. 2.

The cleaning liquid supplying unit 4' has a pipe 45 whose one end is connected to the liquid supplying source 71 and another end communicates with a drain pipe 47 and a pipe 46 whose one end is connected to the nitrogen gas source 72. It is preferable that the drain pipe 47 is attached to the pipe 45 so that the drain pipe 47 faces downward from the pipe 45, more specifically, a discharge port of the drain pipe 47 is attached to a lower surface of a cross-section of the drain pipe 47 so that the discharge port faces downward. The pipe 45 branches at a halfway point Pe of the pipe 45 and joins the pipe 46 at a point Pf. Further, the pipe 45 joins the branch pipe 22a at a point Pg. On the other hand, the pipe 46 joins the branch pipe 22b at a point Ph.

The cleaning liquid supplying unit 4' has an orifice 48 and a check valve 49 provided between the points Pe and Pg on the pipe 45, an orifice 4a and a check valve 4b provided between the points Pe and Pf, a check valve 4c1 provided between the nitrogen gas source 72 and the point Pf on the pipe 46, a check valve 4c2 provided between the points Pf and Ph, and a closing valve 4d provided on the drain pipe 47. By such a configuration, pure water from the liquid supplying source 71 flows in a direction from the point Pe to the point Pg and a direction from the point Pe to the point Pf, and the pure water is supplied to the branch pipes 22a and 22b without flowing back. Nitrogen gas from the nitrogen gas source 72 flows in a direction from the nitrogen gas source 72 to the point Pf and a direction from the point Pf to the point Ph, and the nitrogen gas is supplied to the branch pipe 22b without flowing back.

An opening and closing valve (not shown in the drawings) is provided on an output side of the liquid supplying source 71, and the pure water is supplied by opening the opening and closing valve. Similarly, an opening and closing valve (not shown in the drawings) is provided on an output side of the nitrogen gas source 72, and the nitrogen gas is supplied by opening the opening and closing valve.

FIG. 3 is a flowchart showing an example of a procedure where cleaning liquid (hereinafter the cleaning liquid is sulfuric acid) in the substrate cleaning unit 5A is replaced with pure water in the substrate processing system according to the second embodiment. Sulfuric acid and water react, so that it should be noted that pure water needs to be first supplied to the substrate cleaning unit 5A after removing sulfuric acid in the substrate cleaning unit 5A and the branch pipes 22a and 22b connected to the substrate cleaning unit 5A. Such a replacement is performed during maintenance, so that the substrate W is not arranged in the substrate cleaning unit 5A. Each procedure may be performed manually or may be performed by the controller 6.

First, the closing valves 42 and 44 provided between the circulation line 21 and the substrate cleaning unit 5A on the branch pipes 22a and 22b, respectively, are closed (step S1). Thereby, the circulation line 21 and the substrate cleaning unit 5A are separated from each other. Therefore, circulation of the sulfuric acid can be maintained in the circulation line 21, and the sulfuric acid can be supplied to the other substrate cleaning unit 5B. On the other hand, the sulfuric acid is not supplied from the circulation line 21 to the substrate cleaning unit 5A which is an object of pure water replacement.

Next, the closing valve 4d provided on the drain pipe 47 is opened (step S2). The drain pipe 47 faces down, so that the sulfuric acid remaining in the branch pipe 22a and the nozzle 51a is discharged from the drain pipe 47 by gravity through the point Pg and the pipe 45. The branch pipe 22a faces up, so that the sulfuric acid hardly remains in the branch pipe 22a. When the discharge of the sulfuric acid is completed, the closing valve 4d is closed (step S3).

Nitrogen gas is powerfully supplied from the nitrogen gas source 72 (step S4). The nitrogen gas passes through the branch pipe 22b via the points Pf and Ph and is discharged from the nozzle 51b facing down. The sulfuric acid remaining in the branch pipe 22b and the nozzle 51b is blown out downward from the nozzle 51b by the flow of the nitrogen gas.

The order of the discharge of sulfuric acid from the drain pipe 47 (steps S2 and S3) and the discharge of sulfuric acid by the nitrogen gas (step S4) is not restricted, and they can be performed at the same time. When the sulfuric acid in the branch pipes 22a and 22b and the substrate cleaning unit 5A is removed in this way, the supply of the nitrogen gas is stopped (step S5), and pure water is supplied from the liquid supplying source 71 into the substrate cleaning unit 5A through the branch pipes 22a and 22b (step S6). When the supply of the pure water is completed, the supply of the pure water is stopped (step S7). Thereby, replacement to the pure water is completed.

In this state, necessary maintenance and the like are performed and thereafter the pipes are emptied again.

Specifically, first, the closing valve 4d provided on the drain pipe 47 is opened (step S8). The drain pipe 47 faces down, so that the pure water remaining in the branch pipe 22a and the nozzle 51a is discharged from the drain pipe 47 by gravity through the point Pg and the pipe 45. The branch pipe 22a faces up, so that the pure water hardly remains in the branch pipe 22a. When the discharge of the pure water is completed, the closing valve 4d is closed (step S9).

Nitrogen gas is powerfully supplied from the nitrogen gas source 72 (step S10). The nitrogen gas passes through the branch pipe 22b via the points Pf and Ph and is discharged from the nozzle 51b facing down. The pure water remaining in the branch pipe 22b and the nozzle 51b is blown out downward from the nozzle 51b by the flow of the nitrogen gas. When the pure water in the branch pipes 22a and 22b and the substrate cleaning unit 5A is removed in this way, the supply of the nitrogen gas is stopped (step S10A).

As described above, in the second embodiment, the circulation line 21 and each substrate cleaning unit 5 can be separated from each other by closing the closing valve 42 or 44 in the cleaning liquid supplying units 4'. Therefore, the replacement to the pure water can be performed on only a specific substrate cleaning unit 5A, so that even when the substrate cleaning unit 5A is being maintained, cleaning processing using the cleaning liquid can be performed on the other substrate cleaning unit 5B. Thereby, downtime of the entire substrate processing system can be reduced.

Further, by providing the drain pipe 47 and the nitrogen gas source 72, the pure water that reacts with sulfuric acid can be supplied in a state where the sulfuric acid is removed in advance. It is useful to provide the drain pipe 47 and the nitrogen gas source 72 as described above in a case where the cleaning liquid is replaced by liquid that reacts with the cleaning liquid, in addition to the case where the cleaning liquid is sulfuric acid and the cleaning liquid is replaced by pure water. When the substrate cleaning unit 5A has only a nozzle facing up, the nitrogen gas source 72 may be omitted and the cleaning liquid may be removed from the drain pipe 47. Alternatively, when the substrate cleaning unit 5A has only a nozzle facing down, the drain pipe 47 may be omitted and the cleaning liquid may be removed by the nitrogen gas from the nitrogen gas source 72.

Third Embodiment

A third embodiment described below is an embodiment that can replace liquid in the circulation line 21 with pure water without changing the connection between the cleaning liquid supplying apparatus 1 and the circulation line 21. As shown in FIG. 1A, a plurality of substrate processing apparatuses 100 can be connected to one cleaning liquid supplying apparatus 1. When maintaining the substrate processing apparatus 100, it is necessary to replace the cleaning liquid remaining in pipes and the like in the substrate processing apparatus 100 with pure water. In the case of the substrate processing system as shown in FIG. 1A, to maintain a certain substrate processing apparatus 100, it is necessary to supply pure water instead of the cleaning liquid from the cleaning liquid supplying apparatus 1 to the substrate processing apparatus 100. In this case, the pure water flows through the circulation line 21, so that the cleaning liquid cannot be supplied to the substrate processing apparatuses 100 that will not be maintained. Therefore, use of the substrate processing apparatuses 100 must be stopped.

Therefore, in the third embodiment, as described later, only the cleaning liquid in the substrate processing apparatus 100 to be maintained can be replaced with pure water while the cleaning liquid is being flown through the circulation line 21.

Figure 4:
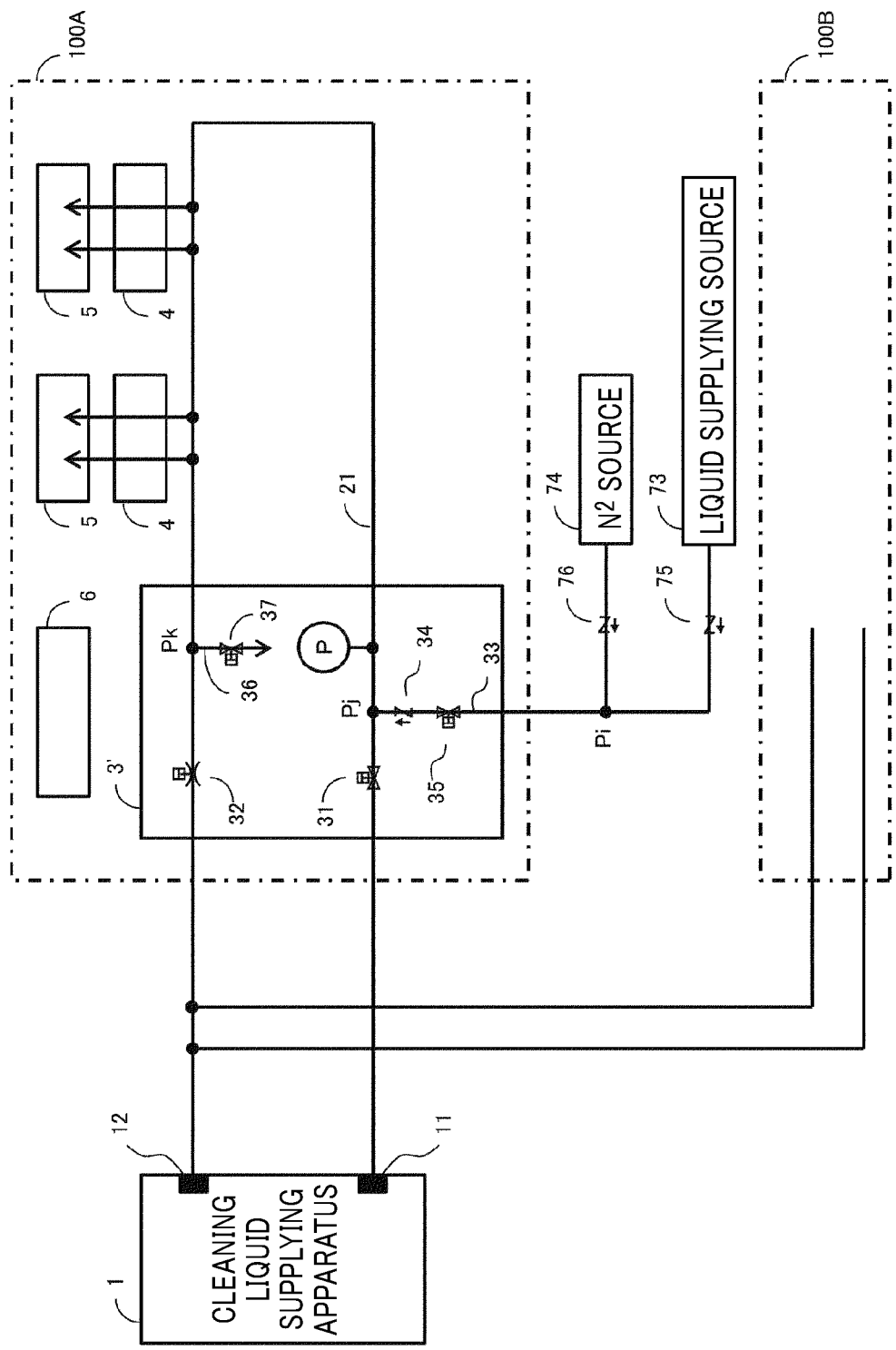
FIG. 4 is a schematic configuration diagram of a substrate processing system according to a third embodiment.

FIG. 4 is a schematic configuration diagram of a substrate processing system according to the third embodiment. In FIG. 4, the same components as those in FIG. 1 are omitted, and only substrate processing apparatuses 100A and 100B, and a liquid supplying source 73 and a nitrogen gas source 74 that are included in the substrate processing system (or the substrate processing apparatus 100A) are drawn. It is desirable that the liquid supplying source 73 and the nitrogen gas source 74 are provided to all the substrate processing apparatuses 100A and 100B. However, the liquid supplying source 73 and the nitrogen gas source 74 may be provided to only one of the substrate processing apparatuses 100A and 100B.

In the description below, it is assumed that the substrate processing apparatus 100A is an object of pure water replacement (maintenance) and the substrate processing apparatus 100B is not an object of pure water replacement (maintenance) in FIG. 4.

A circulation control unit 3' in the present embodiment has a pipe 33 whose one end is connected to the circulation line 21. A point Pj at which the circulation line 21 and the pipe 33 are connected can be any point between the closing valve 31 and the electric flow rate adjusting valve 32 (on the opposite side of the cleaning liquid supplying apparatus 1). The pipe 33 branches at a halfway point Pi and its one branch is connected to the liquid supplying source 73 and another branch is connected to the nitrogen gas source 74.

The circulation control unit 3' has a check valve 34 and a closing valve 35 provided on the pipe 33. Further, a check valve 75 is provided on the pipe 33 between the liquid supplying source 73 and the point Pi. A check valve 76 is provided on the pipe 33 between the nitrogen gas source 74 and the point Pi. By such a configuration, pure water from the liquid supplying source 73 flows in a direction from the point Pi to the circulation line 21 and does not flow back. Nitrogen gas from the nitrogen gas source 74 flows in a direction from the point Pi to the circulation line 21 and does not flow back.

An opening and closing valve (not shown in the drawings) is provided on an output side of the liquid supplying source 73, and the pure water is supplied by opening the opening and closing valve. Similarly, an opening and closing valve (not shown in the drawings) is provided on an output side of the nitrogen gas source 74, and the nitrogen gas is supplied by opening the opening and closing valve.

Further, the circulation control unit 3' has a drain pipe 36 communicating with the circulation line 21 and a closing valve 37 provided on the drain pipe 36. It is desirable that the drain pipe 36 faces down in the same manner as the drain pipe 47. In the present embodiment, a point Pk at which the circulation line 21 and the drain pipe 36 are connected can be any point between the closing valve 31 and the electric flow rate adjusting valve 32 (on the opposite side of the cleaning liquid supplying apparatus 1).

Figure 5:
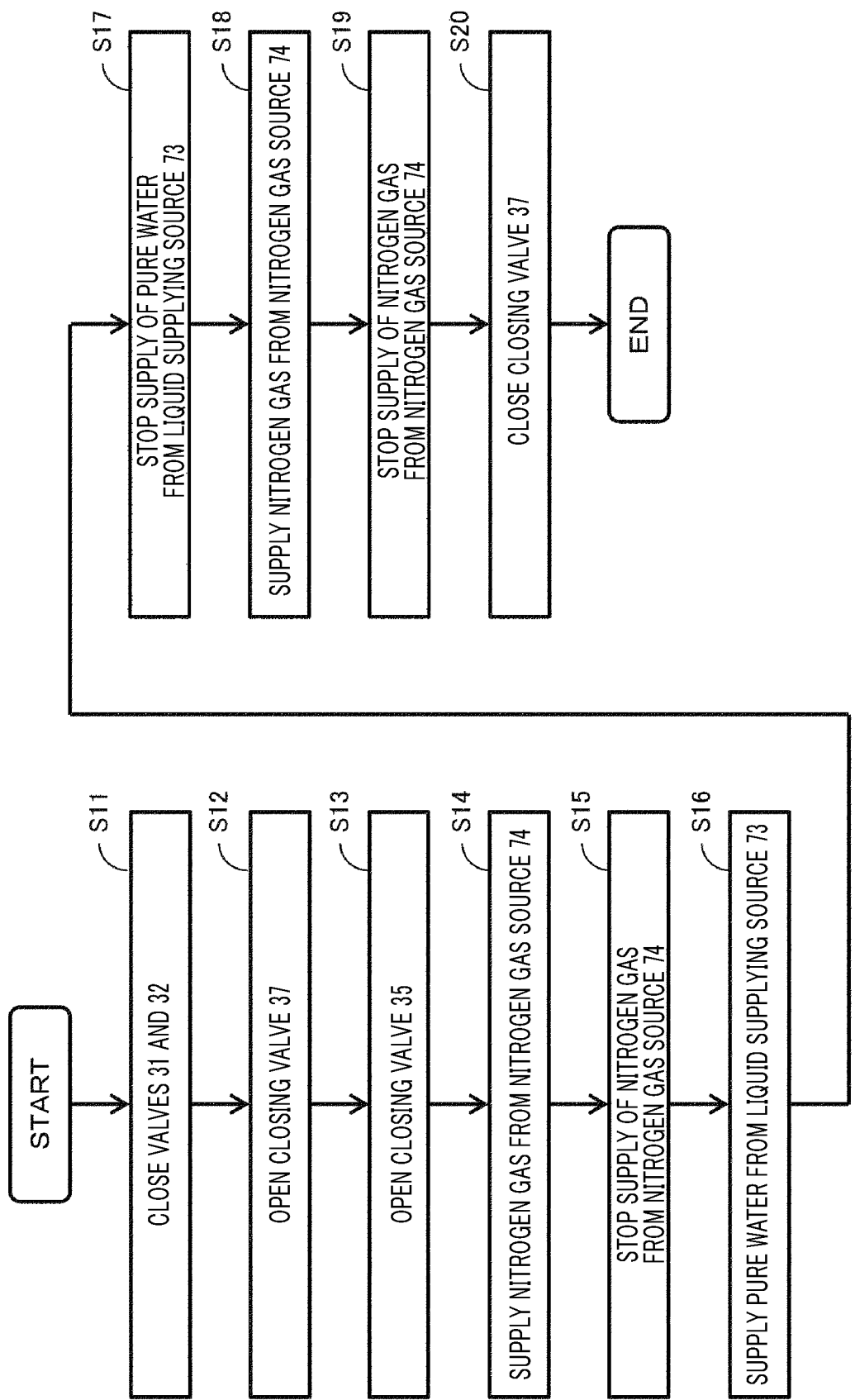
FIG. 5 is a flowchart showing an example of a procedure where cleaning liquid in a substrate processing apparatus 100A is replaced with pure water in the substrate processing system according to the third embodiment.

FIG. 5 is a flowchart showing an example of a procedure where cleaning liquid (hereinafter the cleaning liquid is sulfuric acid) in the substrate processing apparatus 100A is replaced with pure water in the substrate processing system according to the third embodiment. Each procedure may be performed manually or may be performed by the controller 6.

First, the closing valve 31 and the electric flow rate adjusting valve 32 provided on the circulation line 21 are closed (step S11). Thereby, the cleaning liquid supplying apparatus 1 and the substrate processing apparatus 100A are separated from each other. Therefore, the supply of the sulfuric acid from the cleaning liquid supplying apparatus 1 can be maintained, and the sulfuric acid can be supplied to the other substrate processing apparatus 100B. On the other hand, the sulfuric acid is not supplied from the cleaning liquid supplying apparatus 1 to the substrate processing apparatus 100A which is an object of pure water replacement.

Next, the closing valve 37 provided on the drain pipe 36 is opened (step S12). The drain pipe 36 faces down, so that the sulfuric acid remaining in the circulation line 21 is discharged from the drain pipe 36 by gravity.

The closing valve 35 is opened (step S13), and the nitrogen gas is supplied from the nitrogen gas source 74 (step S14). The nitrogen gas passes through the circulation line 21 and is discharged from the drain pipe 36. The sulfuric acid remaining in the circulation line 21 is blown out downward from the drain pipe 36 by the flow of the nitrogen gas. In order to efficiently remove the sulfuric acid in the circulation line 21, the nitrogen gas should be discharged from the drain pipe 36 after the nitrogen gas passes through as much part as possible in the circulation line 21. From that point of view, it is desirable that one of the points Pj and Pk is arranged close to the valve 31 as much as possible and the other point is arranged close to the valve 32.

When the sulfuric acid in the circulation line 21 is removed in this way, the supply of the nitrogen gas is stopped (step S15). Then, the pure water is supplied from the liquid supplying source 73 into the circulation line 21 (step S16). When the supply of the pure water is completed, the supply of the pure water is stopped (step S17). Thereby, replacement to the pure water is completed.

In this state, necessary maintenance and the like are performed and thereafter the circulation line 21 is emptied again. Specifically, first, the nitrogen gas is supplied from the nitrogen gas source 74 (step S18). The nitrogen gas passes through the circulation line 21 and is discharged from the drain pipe 36. The pure water remaining in the circulation line 21 is blown out downward from the drain pipe 36 by the flow of the nitrogen gas.

When the pure water in the circulation line 21 is removed in this way, the supply of the nitrogen gas is stopped (step S19), and further the closing valve 37 is closed (step S20).

Figure 6:
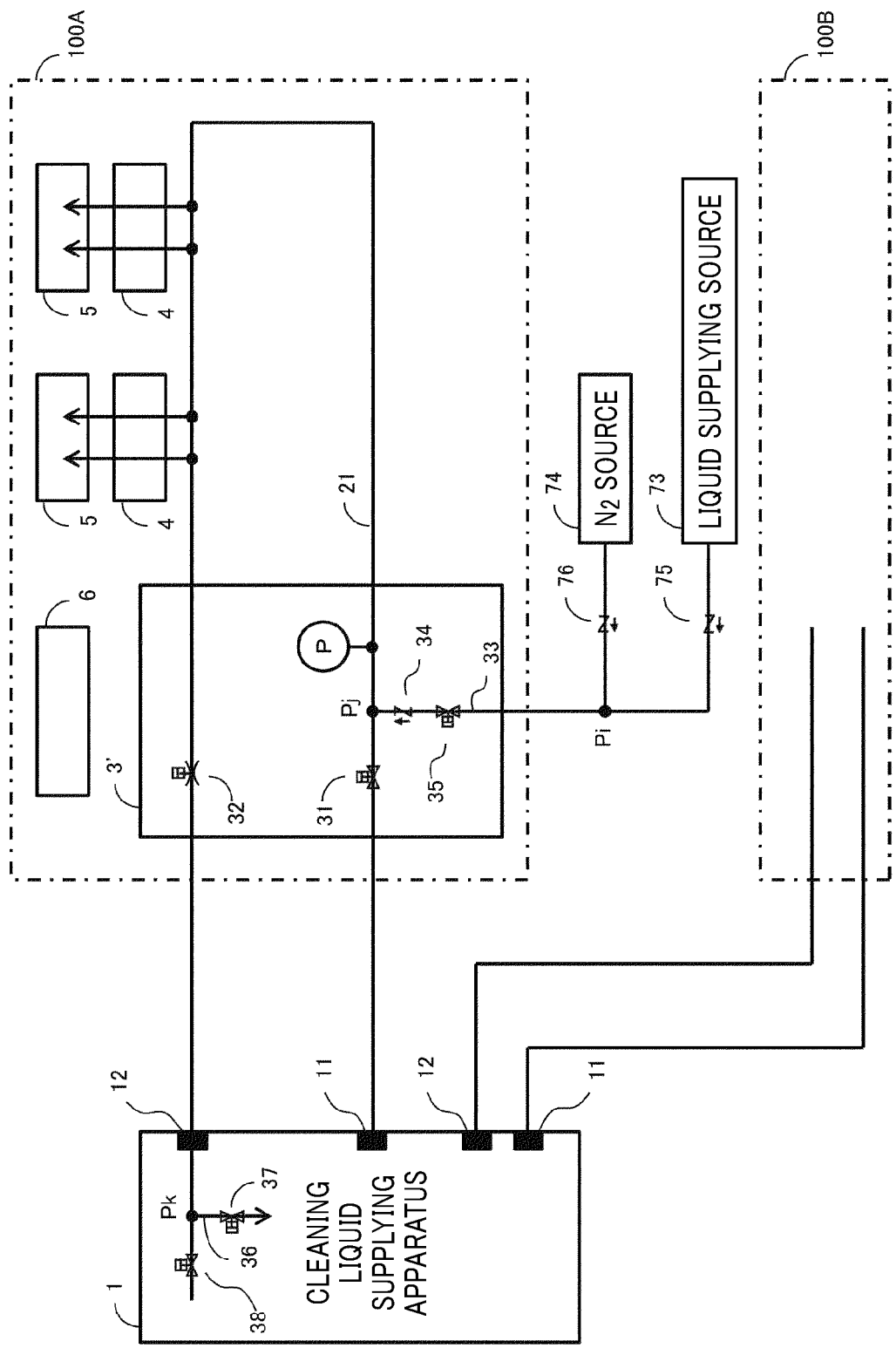
FIG. 6 is a schematic configuration diagram of a substrate processing system which is a modified example of FIG. 4.

FIG. 6 is a schematic configuration diagram of a substrate processing system which is a modified example of FIG. 4.

Different from FIG. 4, as shown in FIG. 1B, the circulation line 21 of each substrate processing apparatus 100 is connected to individual supply port 11 and collection port 12 of the cleaning liquid supplying apparatus 1. The point Pk at which the circulation line 21 and the drain pipe 36 are connected is provided on the downstream side of the electric flow rate adjusting valve 32. FIG. 6 shows an example where the point Pk is provided in the cleaning liquid supplying apparatus 1 (that is, the closing valves 37 and 38 are provided in the cleaning liquid supplying apparatus 1). The closing valve 38 is provided more outside of the point Pk. While FIG. 6 shows an example applied to FIG. 1B, of course, the example shown in FIG. 6 can also be applied to FIG. 1A.

Figure 7:
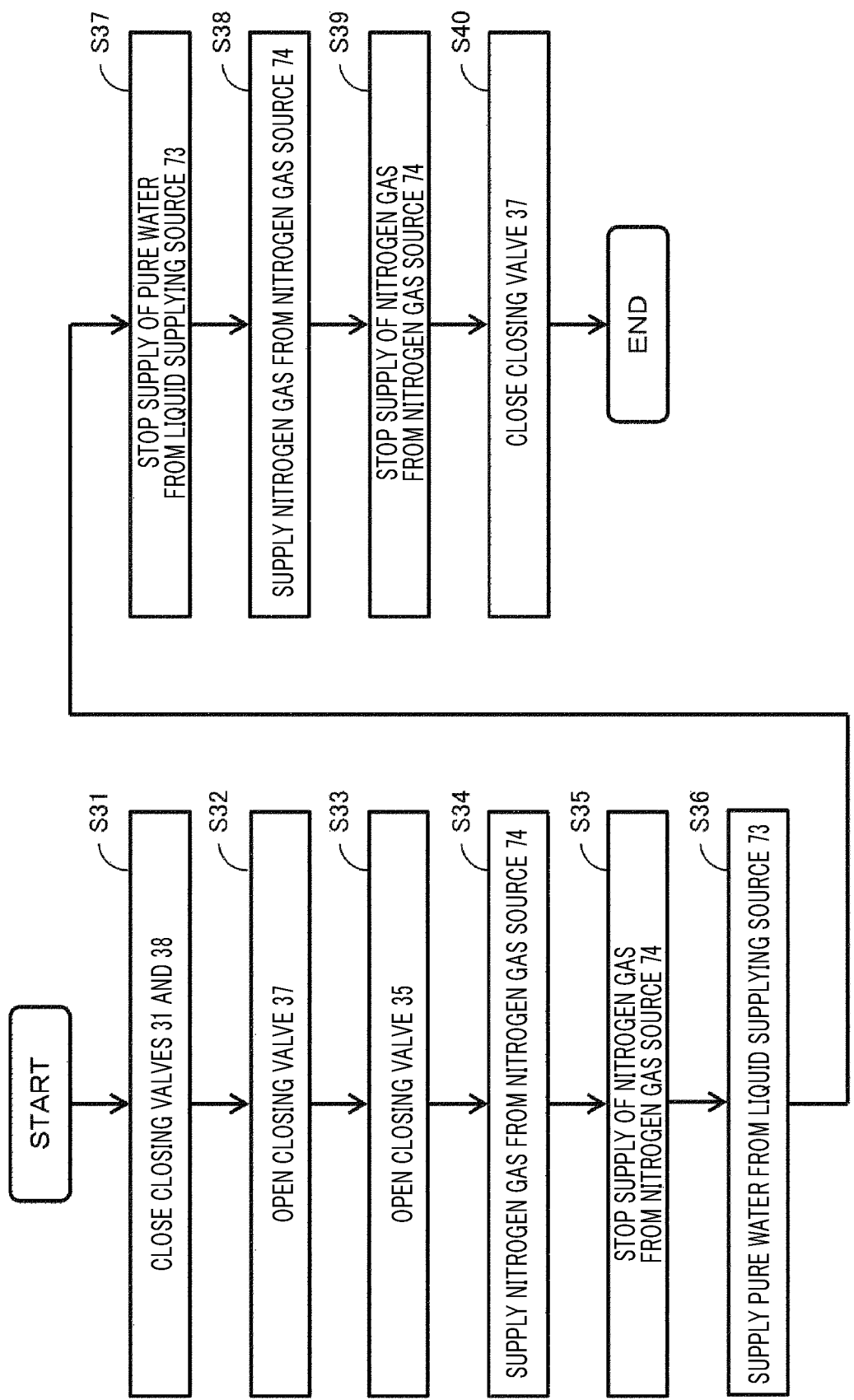
FIG. 7 is a flowchart showing an example of a procedure where cleaning liquid in a substrate processing apparatus 100A is replaced with pure water in the substrate processing system of FIG. 6.

FIG. 7 is a flowchart showing an example of a procedure where cleaning liquid (hereinafter the cleaning liquid is sulfuric acid) in the substrate processing apparatus 100A is replaced with pure water in the substrate processing system shown in FIG. 6. Each procedure may be performed manually or may be performed by the controller 6.

First, the closing valves 31 and 38 provided on the circulation line 21 are closed (step S31). Next, the closing valve 37 provided on the drain pipe 36 is opened (step S32). Then, the closing valve 35 is opened (step S33), and the nitrogen gas is supplied from the nitrogen gas source 74 (step S34). The nitrogen gas passes through the circulation line 21 and is discharged from the drain pipe 36 into the cleaning liquid supplying apparatus 1. The sulfuric acid remaining in the circulation line 21 is blown out downward from the drain pipe 36 by the flow of the nitrogen gas. In order to efficiently remove the sulfuric acid in the circulation line 21, the nitrogen gas should be discharged from the drain pipe 36 after the nitrogen gas passes through as much part as possible in the circulation line 21. From that point of view, it is desirable that the point Pj is arranged close to the valve 31 as much as possible and the point Pk point is arranged away from the valve 32 (in other words, arranged close to the closing valve 38).

When the sulfuric acid in the circulation line 21 is removed in this way, the supply of the nitrogen gas is stopped (step S35). Then, the pure water is supplied from the liquid supplying source 73 into the circulation line 21 (step S36). When the supply of the pure water is completed, the supply of the pure water is stopped (step S37). Thereby, replacement to the pure water is completed.

In this state, necessary maintenance and the like are performed and thereafter the circulation line 21 is emptied again. Specifically, first, the nitrogen gas is supplied from the nitrogen gas source 74 (step S38). The nitrogen gas passes through the circulation line 21 and is discharged from the drain pipe 36 into the cleaning liquid supplying apparatus 1. The pure water remaining in the circulation line 21 is blown out downward from the drain pipe 36 by the flow of the nitrogen gas. When the pure water in the circulation line 21 is removed in this way, the supply of the nitrogen gas is stopped (step S39), and further the closing valve 37 is closed (step S40).

As described above, in the third embodiment, the cleaning liquid supplying apparatus 1 and each substrate processing apparatus 100 can be separated from each other by closing the valves 31 and 32 in the circulation control unit 3' in FIG. 4 or by closing the valve 31 in the circulation control unit 3' and the closing valve 38 in the cleaning liquid supplying apparatus 1 in FIG. 6. Therefore, the replacement to the pure water can be performed on only a specific substrate processing apparatus 100A, so that even when the substrate processing apparatus 100A is being maintained, cleaning processing using the cleaning liquid can be performed on the other substrate processing apparatus 100B. Thereby, downtime of the entire substrate processing system can be reduced.

Further, by providing the drain pipe 36 and the nitrogen gas source 74, the pure water that reacts with sulfuric acid can be supplied in a state where the sulfuric acid is removed in advance. It is useful to provide the drain pipe 36 and the nitrogen gas source 74 as described above in a case where the cleaning liquid is replaced by liquid that reacts with the cleaning liquid, in addition to the case where the cleaning liquid is sulfuric acid and the cleaning liquid is replaced by pure water.

In the third embodiment, two aspects including an aspect of FIG. 4 and an aspect of FIG. 6 are illustrated. As shown in FIG. 2, there are a plurality of substrate cleaning units 5A and 5B in each substrate processing apparatus, and there are a plurality of lines of a plurality of substrate processing apparatuses in a semiconductor manufacturing factory. Further, types of cleaning liquid used in each substrate cleaning unit and each substrate processing apparatus may be different according to types of processing object substrate. On the other hand, the system as shown in FIG. 4 may be provided for each substrate cleaning unit. Alternatively, when there is a line that supplies the same cleaning liquid in a semiconductor manufacturing factory, a circulation control unit may be provided as if the circulation control unit were provided in the cleaning liquid supplying apparatus 1 placed outside the substrate processing apparatus as shown in FIG. 6 which is a modified example of FIG. 4.

An aspect of the substrate cleaning unit 5 in the first to the third embodiments described above is not particularly limited. For example, the substrate cleaning unit 5 may use two roll sponges arranged on the upper and lower surfaces of the substrate W and clean both surfaces at the same time while ejecting the cleaning liquid to the upper and lower surfaces of the substrate W. Alternatively, the substrate cleaning unit 5 may use a pencil type sponge and clean only the upper surface of the substrate W while ejecting the cleaning liquid to the upper surface of the substrate W. As the cleaning liquid supplied from the cleaning liquid supplying apparatus 1, it is possible to use high-temperature pure water, APM (Ammonium Hydrogen-peroxide Mixture; mixed liquid of ammonium and hydrogen peroxide), SPM (Sulfuric-Acid Hydrogen Peroxide Mixture; mixed liquid of sulfuric acid and hydrogen peroxide), carbonated water, and the like. It is possible to arbitrarily combine items described in the first to the third embodiments.

Furthermore, in one embodiment, the substrate cleaning unit 5 in the first to the third embodiments may be provided with a position adjustment mechanism that adjusts relative heights or positions of a plurality of nozzles so that regions to which chemical liquid is supplied from the nozzles are not overlapped with each other when the chemical liquid is supplied onto a substrate from the nozzles at the same time in a case where the substrate is cleaned by using the plurality of nozzles while using the chemical liquid from one cleaning liquid supplying source. Furthermore, in another embodiment, the substrate cleaning unit 5 in the first to the third embodiments may have a configuration where relative heights/positions of a plurality of nozzles are fixed in advance by a fixing mechanism so that regions to which chemical liquid is supplied from the nozzles are not overlapped with each other when the chemical liquid is supplied onto a substrate from the nozzles at the same time in a case where the substrate is cleaned by using the plurality of nozzles while using the chemical liquid from one cleaning liquid supplying source.

In the described embodiments, various flow rate adjusters can be applied. For example, the flow rate adjuster can be an electromagnetic flow valve which is controlled by a motor, a pneumatic flow rate adjustment valve which adjusts the flow rate by electro-pneumatic pressure, an air constant pressure valve which adjusts pressure by electro-pneumatic pressure. Further, the valves whose number is corresponding to that of substrate cleaning units is provided on the circulation line. In this case, when a valve provided on the branch pipe is opened, proper number of the valves may be closed to keep the pressure in the circulation line.

According to one embodiment, provided is a cleaning liquid supplying system comprising: a circulation line in which cleaning liquid flows, first end of the circulation line being connected to a supply port of a cleaning liquid supplying apparatus, second end of the circulation line being connected to a collection port of the cleaning liquid supplying apparatus; a branch pipe branched from the circulation line and connected to a substrate cleaning unit; a valve provided on the branch pipe and configured to control supply of cleaning liquid from the circulation line to the substrate cleaning unit; and a flow rate adjuster configured to adjust a flow rate of the cleaning liquid flowing in the circulation line.

Preferably, the flow rate adjuster reduces the flow rate of the cleaning liquid flowing in the circulation line so as to suppress decrease of pressure in the circulation line even when the valve is opened.

Preferably, the cleaning liquid supplying system further comprising a pressure gauge configured to measure pressure in the circulation line, wherein the flow rate adjuster adjusts the flow rate of the cleaning liquid flowing in the circulation line based on the pressure in the circulation line.

Preferably, the flow rate adjuster is an electric flow rate adjusting valve provided on the circulation line.

According to one embodiment, provided is a cleaning liquid supplying system comprising: a circulation line in which cleaning liquid flows, first end of the circulation line being connected to a supply port of a cleaning liquid supplying apparatus, second end of the circulation line being connected to a collection port of the cleaning liquid supplying apparatus; a branch pipe branched from the circulation line and connected to a substrate cleaning unit; a nitrogen gas supplying source configured to supply nitrogen gas to the branch pipe; a liquid supplying source configured to supply liquid that reacts with the cleaning liquid to the branch pipe; and a valve provided on the branch pipe and configured to control supply of liquid from the circulation line to the substrate cleaning unit, wherein in a state where the cleaning liquid is not supplied from the circulation line to the substrate cleaning unit, the valve enables supplying the nitrogen gas from the nitrogen gas supplying source to the substrate cleaning unit, and supplying the liquid from the liquid supplying source to the substrate cleaning unit.

Preferably, the branch pipe branched from the circulation line and to which nitrogen gas is supplied is connected to a nozzle facing down in the substrate cleaning unit.

Preferably, the cleaning liquid supplying system further comprising: a controller configured to control the valve, the nitrogen gas supplying source, and the liquid supplying source so as to set a status where the cleaning liquid is not supplied from the circulation line to the substrate cleaning unit, thereafter supply the nitrogen gas from the nitrogen gas supplying source to the substrate cleaning unit, and thereafter supply the liquid from the liquid supplying source to the substrate cleaning unit.

According to one embodiment, provided is a cleaning liquid supplying system comprising: a circulation line in which cleaning liquid flows, first end of the circulation line being connected to a supply port of a cleaning liquid supplying apparatus, second end of the circulation line being connected to a collection port of the cleaning liquid supplying apparatus; a branch pipe branched from the circulation line and connected to a substrate cleaning unit; a liquid supplying source configured to supply liquid that reacts with the cleaning liquid to the branch pipe; a drain pipe configured to communicate with the branch pipe; a first valve provided on the branch pipe and configured to control supply of liquid from the circulation line to the substrate cleaning unit; and a second valve provided on the drain pipe, wherein in a state where the cleaning liquid is not supplied from the circulation line to the substrate cleaning unit, the first valve and the second valve enable discharging the cleaning liquid in the branch pipe from the drain pipe, and supplying the liquid from the liquid supplying source to the substrate cleaning unit.

Preferably, the branch pipe branched from the circulation line and to which the drain pipe is connected is connected to a nozzle facing up in the substrate cleaning unit.

Preferably, the cleaning liquid supplying system further comprising: a controller configured to control the first valve, the second valve, and the liquid supplying source so as to set a status where the cleaning liquid is not supplied from the circulation line to the substrate cleaning unit, thereafter discharge the cleaning liquid in the branch pipe from the drain pipe, and thereafter supply the liquid from the liquid supplying source to the substrate cleaning unit.

According to one embodiment, provided is a cleaning liquid supplying system comprising: a circulation line in which cleaning liquid flows, first end of the circulation line being connected to a supply port of a cleaning liquid supplying apparatus, second end of the circulation line being connected to a collection port of the cleaning liquid supplying apparatus; a branch pipe branched from the circulation line and connected to a substrate cleaning unit; a nitrogen gas supplying source configured to supply nitrogen gas to the circulation line through a pipe; a liquid supplying source configured to supply liquid that reacts with the cleaning liquid to the circulation line through the pipe; a drain pipe configured to be connected to the circulation line; a first valve provided on the pipe and configured to control supply of nitrogen gas from the nitrogen gas supplying source to the circulation line and supply of liquid from the liquid supplying source to the circulation line; and a second valve provided on the drain pipe, wherein in a state where the cleaning liquid is not supplied from the cleaning liquid supplying apparatus to the circulation line, the first valve and the second valve enable discharging the cleaning liquid in the circulation line from the drain pipe, supplying the nitrogen gas from the nitrogen gas supplying source to the circulation line, and supplying the liquid from the liquid supplying source to the circulation line.

Preferably, the cleaning liquid supplying system further comprising: a controller configured to control the first valve, the second valve, the nitrogen gas supplying source, and the liquid supplying source so as to set a status where the cleaning liquid is not supplied from the cleaning liquid supplying apparatus to the circulation line, thereafter discharge the cleaning liquid in the circulation line from the drain pipe, thereafter supply the nitrogen gas from the nitrogen gas supplying source to the circulation line, and thereafter supply the liquid from the liquid supplying source to the circulation line.

According to one embodiment, provided is a cleaning liquid supplying system comprising: a circulation line in which cleaning liquid flows, first end of the circulation line being connected to a supply port of a cleaning liquid supplying apparatus, second end of the circulation line being connected to a collection port of the cleaning liquid supplying apparatus; a branch pipe branched from the circulation line and connected to a substrate cleaning unit; a nitrogen gas supplying source configured to supply nitrogen gas to the circulation line through a pipe; a liquid supplying source configured to supply liquid that reacts with the cleaning liquid to the circulation line through the pipe; and a valve provided on the pipe and configured to control supply of nitrogen gas from the nitrogen gas supplying source to the circulation line and supply of liquid from the liquid supplying source to the circulation line.

Preferably, the cleaning liquid is sulfuric acid and the liquid is pure water.

According to one embodiment, provided is a substrate processing apparatus comprising: the substrate cleaning unit; and the cleaning liquid supplying system.

According to one embodiment, provided is a substrate processing system comprising: the cleaning liquid supplying apparatus; and the substrate processing apparatus.

The above embodiments are described so that a person with an ordinary skill in the technical field to which the invention pertains can implement the invention. Various modified examples of the above embodiments can be naturally made by those skilled in the art, and the technical idea of the invention can be applied to other embodiments. Therefore, the invention is not limited to the described embodiments and should encompass the widest range in accordance with the technical ideas defined by the claims.

What is claimed is:

1. A cleaning liquid supplying system comprising:
   a circulation line in which cleaning liquid flows, a first end of the circulation line being connected to a supply port of a cleaning liquid supplying apparatus, a second end of the circulation line being connected to a collection port of the cleaning liquid supplying apparatus;
   a branch pipe branched from the circulation line and connected to a substrate cleaning unit;
   a plurality of valves provided on the branch pipe and configured to control the supply of cleaning liquid from the circulation line to the substrate cleaning unit;
   a nitrogen gas supplying source;
   a first pipe in which nitrogen gas flows from the nitrogen gas supplying source to a first point (Ph) on the branch pipe that is not through the circulation line, wherein the first point is between the plurality of valves and the substrate cleaning unit;
   a first check valve provided on the first pipe;
   a liquid supplying source;
   a second pipe in which liquid flows from the liquid supplying source to a second point (Pg) on the branch pipe that is not through the circulation line, wherein the second point is between the plurality of valves and the substrate cleaning unit;
   a second check valve provided on the second pipe;
   a communication passage (Pf-Pe) which allows the first pipe and the second pipe to communicate with each other; and
   a third check valve provided on the communication passage (Pf-Pe).

2. The cleaning liquid supplying system according to claim 1, wherein the branch pipe branched from the circulation line and to which nitrogen gas is supplied is connected to a nozzle facing down in the substrate cleaning unit.

3. The cleaning liquid supplying system according to claim 1, further comprising: a controller configured to control the plurality of valves, the nitrogen gas supplying source, and the liquid supplying source so as to
   set a status where the cleaning liquid is not supplied from the circulation line to the substrate cleaning unit,
   thereafter supply the nitrogen gas from the nitrogen gas supplying source to the substrate cleaning unit, and
   thereafter supply the liquid from the liquid supplying source to the substrate cleaning unit.

4. The cleaning liquid supplying system according to claim 1, wherein the cleaning liquid is sulfuric acid and the liquid is pure water.

5. A substrate processing apparatus comprising:
   the substrate cleaning unit; and
   the cleaning liquid supplying system according to claim 1.

6. A substrate processing system comprising:
   the cleaning liquid supplying apparatus; and
   the substrate processing apparatus according to claim 5.

7. A cleaning liquid supplying system comprising:
   a circulation line in which cleaning liquid flows, a first end of the circulation line being connected to a supply port of a cleaning liquid supplying apparatus, a second end of the circulation line being connected to a collection port of the cleaning liquid supplying apparatus;
   a branch pipe branched from the circulation line and connected to a substrate cleaning unit;
   a plurality of first valves provided on the branch pipe and configured to control supply of the cleaning liquid from the circulation line to the substrate cleaning unit;
   a liquid supplying source;
   a first pipe in which liquid that reacts with the cleaning liquid flows from the liquid supplying source to a first point (Pg) on the branch pipe that is not through the circulation line, wherein the first point is between the plurality of first valves and the substrate cleaning unit;
   a drain pipe configured to communicate with the first point (Pg) on the branch pipe, wherein a discharge port of the drain pipe is not connected to the circulation line;
   a second valve provided at a second point on the drain pipe, wherein the second point is between the first point and the discharge port.

8. The cleaning liquid supplying system according to claim 7, wherein the branch pipe branched from the circulation line and to which the drain pipe is connected to a nozzle facing up in the substrate cleaning unit.

9. The cleaning liquid supplying system according to claim 7, further comprising: a controller configured to control the plurality of first valves, the second valve, and the liquid supplying source so as to
   set a status where the cleaning liquid is not supplied from the circulation line to the substrate cleaning unit,
   thereafter discharge the cleaning liquid in the branch pipe from the drain pipe, and
   thereafter supply the liquid from the liquid supplying source to the substrate cleaning unit.

* * * * *